United States Patent
Yim et al.

(10) Patent No.: US 8,933,443 B2
(45) Date of Patent: Jan. 13, 2015

(54) ORGANIC LIGHT-EMITTING DISPLAY APPARATUS PROVIDING MIRROR FUNCTION

(71) Applicant: Samsung Display Co., Ltd., Yongin, Gyeonggi-do (KR)

(72) Inventors: Sang-Hoon Yim, Yongin (KR); Seong-Min Kim, Yongin (KR); Kyung-Ho Kim, Yongin (KR); Won-Jong Kim, Yongin (KR); Young-Woo Song, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/042,179

(22) Filed: Sep. 30, 2013

(65) Prior Publication Data
US 2014/0299850 A1  Oct. 9, 2014

(30) Foreign Application Priority Data
Apr. 9, 2013 (KR) .................. 10-2013-0038842

(51) Int. Cl.
*H01L 51/52* (2006.01)
*H01L 33/60* (2010.01)

(52) U.S. Cl.
CPC ............ *H01L 51/5271* (2013.01); *H01L 33/60* (2013.01)
USPC ............... 257/40; 257/98; 438/27; 438/99

(58) Field of Classification Search
CPC ............... H01L 51/5271; H01L 33/60
USPC .................... 257/40, 98; 438/27, 99
See application file for complete search history.

(56) References Cited

U.S. PATENT DOCUMENTS

| | | | | |
|---|---|---|---|---|
| 7,968,895 B2 * | 6/2011 | Lin et al. | ............. | 257/88 |
| 8,084,939 B2 * | 12/2011 | Choi et al. | ............. | 313/506 |
| 8,168,983 B2 * | 5/2012 | Yagi | ............. | 257/72 |
| 2007/0152570 A1 * | 7/2007 | Jung | ............. | 313/504 |
| 2007/0278493 A1 * | 12/2007 | Sato | ............. | 257/72 |
| 2009/0236981 A1 | 9/2009 | Chang et al. | | |
| 2010/0015424 A1 * | 1/2010 | Seo et al. | ............. | 428/216 |
| 2010/0201609 A1 | 8/2010 | Kim | | |

(Continued)

FOREIGN PATENT DOCUMENTS

| JP | 2005-332616 A | | 12/2005 |
|---|---|---|---|
| JP | 2006-011043 A | | 1/2006 |
| KR | 2007050781 A | * | 5/2007 |
| KR | 10-2009-0099744 A | | 9/2009 |

*Primary Examiner* — Allan R Wilson
(74) *Attorney, Agent, or Firm* — Robert E. Bushnell, Esq.

(57) ABSTRACT

An organic light-emitting display apparatus may include a substrate, a display portion formed on the substrate and including a light-emitting area and a non-light-emitting area surrounding the light-emitting area, an encapsulation member arranged to face the substrate with the display portion interposed therebetween, and a reflection member provided on the encapsulation member and including an opening portion aligned with the light-emitting area and a reflection portion surrounding the opening portion and extending to cover the non-light-emitting area, the opening portion comprising an opening. The size of the opening may be smaller than that of the light-emitting area and thus an edge of the light-emitting area may be covered by the reflection portion. The opening portion may have an inverted taper shape, the size of the opening gradually increasing toward the display portion.

11 Claims, 5 Drawing Sheets

(56) References Cited

U.S. PATENT DOCUMENTS

| | | | |
|---|---|---|---|
| 2011/0156015 A1* | 6/2011 | Cho et al. | 257/40 |
| 2012/0097928 A1* | 4/2012 | Kim et al. | 257/40 |
| 2012/0299472 A1 | 11/2012 | Chang et al. | |
| 2013/0187840 A1* | 7/2013 | Tomita et al. | 345/76 |
| 2014/0057376 A1* | 2/2014 | Seo et al. | 438/29 |

* cited by examiner

ORGANIC LIGHT-EMITTING DISPLAY APPARATUS PROVIDING MIRROR FUNCTION

CLAIM OF PRIORITY

This application makes reference to, incorporates the same herein, and claims all benefits accruing under 35 U.S.C. §119 from an application for ORGANIC LIGHT-EMITTING DISPLAY APPARATUS PROVIDING MIRROR FUNCTION, earlier filed in the Korean Intellectual Property Office on Apr. 9, 2013, and there duly assigned Serial No. 10-2013-0038842.

BACKGROUND OF THE INVENTION

1. Field of the Invention

The present invention relates to an organic light-emitting display apparatus, and, more particularly, to an organic light-emitting display apparatus providing a minor function.

2. Description of the Related Art

Display apparatuses are currently being replaced with portable, slim flat panel display apparatuses. Among the flat panel display apparatuses, an organic light-emitting apparatus is a self-illumination type of display apparatus and is highlighted as a next generation display apparatus because of its wide viewing angle, superior contrast, and fast response speed.

Recently, a mirror function that allows a user to use an organic light-emitting apparatus as a minor has drawn wide attention. The mirror function enables a user to use a screen of an organic light-emitting apparatus as a minor when the organic light-emitting apparatus is not in use.

To this end, specular reflection, that is, clear and uniform reflection of incident light by a screen, is needed. However, inclined surfaces that prevent uniform reflection are formed in pixels that are disposed everywhere in a screen of an organic light-emitting apparatus. The inclined surfaces cause diffuse reflection of incident light from the outside. Accordingly, an image on the screen appears to be unclear and dim. Thus, a solution to restrict such diffuse reflection is needed in order to embody clear reflection like a minor on the screen of an organic light-emitting apparatus.

SUMMARY OF THE INVENTION

The present invention provides an organic light-emitting apparatus that restricts diffuse reflection of incident light, thereby providing a clear mirror function through a screen of the organic light-emitting apparatus.

According to an embodiment of the present invention, an organic light-emitting display apparatus includes a substrate, a display portion formed on the substrate and including a light-emitting area and a non-light-emitting area surrounding the light-emitting area, an encapsulation member arranged to face the substrate with the display portion interposed therebetween, and a reflection member provided on the encapsulation member and including an opening portion aligned with the light-emitting area and a reflection portion surrounding the opening portion and extending to cover the non-light-emitting area, the opening portion comprising an opening, a size of the opening being smaller than that of the light-emitting area and thus an edge of the light-emitting area being covered by the reflection portion, the opening portion having an inverted taper shape, the size of the opening gradually increasing toward the display portion.

An inclined surface may be formed on the edge of the light-emitting area that is covered by the reflection portion.

The inclined surface may diffusely reflect externally incident light.

The light-emitting area may include a plurality of pixels that emit light of different colors.

The plurality of pixels may include a pixel electrode connected to a thin film transistor, a pixel-defining film defining an area of each of the plurality of pixels, an opposing electrode facing the pixel electrode, and a light-emitting layer interposed between the pixel electrode and the opposing electrode in the pixel-defining film.

The inclined surface may be formed along a boundary surface of the pixel-defining film surrounding each of the plurality of pixels.

The non-light-emitting area may include a circuit wiring portion and a transmission portion.

The size of the opening portion of the reflection member may gradually increase towards the display portion.

The reflection member may be formed on a surface of the encapsulation member that faces the display portion.

The reflection member may be formed on a surface opposite to the surface of the encapsulation member that faces the display portion.

The reflection portion of the reflection member may have a specular reflection characteristic.

The reflection member may include any one of nickel (Ni), chromium (Cr), tungsten (W), vanadium (V), and molybdenum (Mo).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
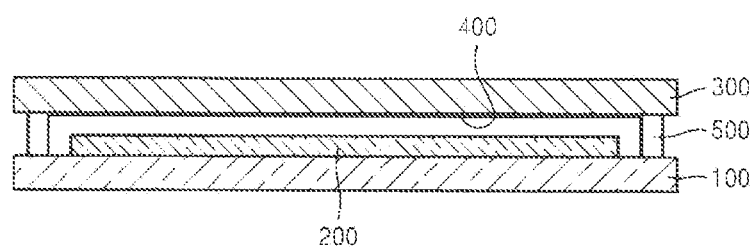
FIG. 1 is a cross-sectional view schematically illustrating an organic light-emitting apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
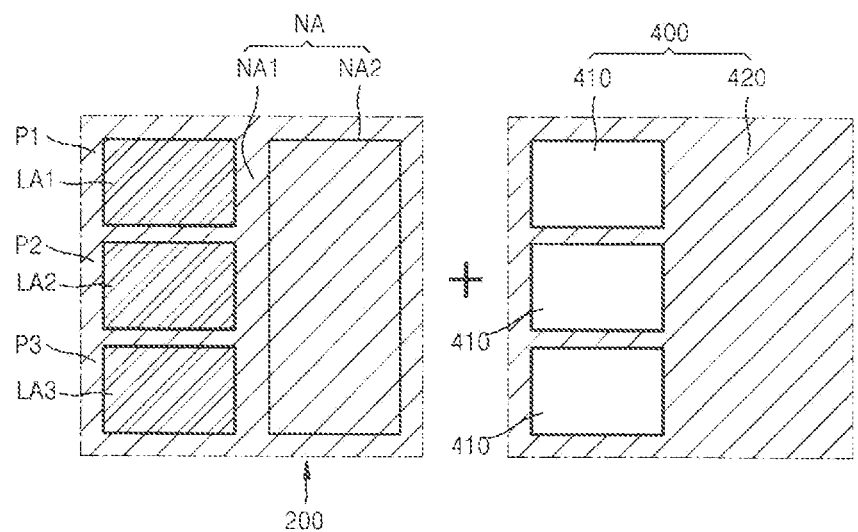
FIG. 2 is a view schematically illustrating a matching structure between a display portion and a reflection member of FIG. 1.
Figure 3:
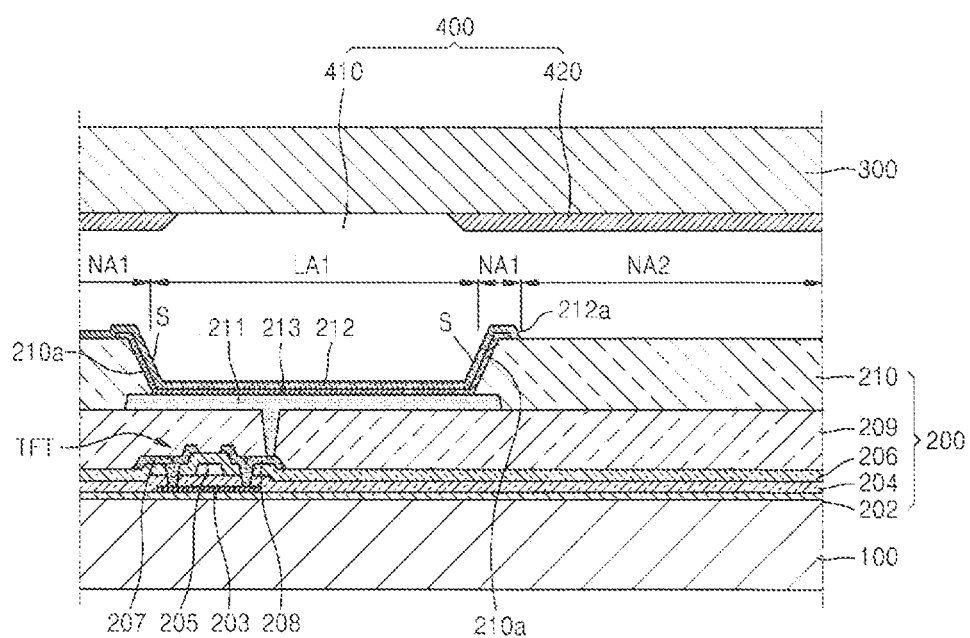
FIG. 3 is a cross-sectional view schematically illustrating a part of the organic light-emitting apparatus of FIG. 1.

FIG. 1 is a cross-sectional view schematically illustrating an organic light-emitting apparatus according to an embodiment of the present invention. FIG. 2 is a view schematically illustrating a matching structure between a display portion 200 and a reflection member 400 of FIG. 1. FIG. 3 is a cross-sectional view schematically illustrating a light-emitting part of the organic light-emitting apparatus of FIG. 1.

Referring to FIG. 1 first, the organic light-emitting apparatus may include a substrate 100, an encapsulation member 300, and the display portion arranged therebetween. In other words, the display portion 200 may be formed on the substrate 100, and the encapsulation member 300 may hermetically seal the display portion 200 by covering the same, thereby protecting the organic light-emitting apparatus from external oxygen and moisture.

The substrate 100 and the encapsulation member 300 may be combined by a sealant 500. A space between the substrate 100 and the encapsulation member 300 sealed by the sealant 500 may be filled with a dehydrator or a filler. The substrate 100 and the encapsulation member 300 may be formed of transparent glass or a transparent plastic material. The reflection member 400 may reflect external light to allow a screen of an organic light-emitting apparatus to be used as a mirror. The structure of an embodiment of the reflection member 400 of the present invention is described in detail later.

The display portion 200 may include a plurality of pixels P1, P2, and P3 that emit light of particular colors.

Referring to FIG. 2, three pixels P1, P2, and P3 may emit light of different colors, for example, red (R), green (G), and blue (B), thus forming an appropriate color by combining the different colors. Areas where the pixels P1, P2, and P3 are present are light-emitting areas LA1, LA2, and LA3, respectively. An area surrounding the light-emitting areas LA1, LA2, and LA3 is a non-light-emitting area NA.

As illustrated in FIG. 1, the reflection member 400 may be provided on an inner surface of the encapsulation member 300 that faces the display portion 200. The reflection member 400 may include openings 410 formed in portions corresponding to the light-emitting areas LA1, LA2, and LA3 and a reflection portion 420 formed in a portion corresponding to the non-light-emitting area NA, as illustrated in FIG. 2. As described above, since the reflection member 400 may be formed on one surface of the encapsulation member 300 to provide a mirror function by reflecting external light, the non-light-emitting area NA may be completely covered by the reflection portion 420, but the light-emitting areas LA1, LA2, and LA3 through which lights for forming an image pass may not be covered, and thus the openings 410 are formed in corresponding portions so as to allow the light to pass through. Accordingly, light may be reflected by the reflection portion 420 at a reflection rate of almost 100%. In the light-emitting areas LA1, LA2, and LA3 exposed by the openings 410, when not in use, a reflection rate of about 60% may be obtained, and thus the light-emitting areas LA1, LA2, and LA3 may serve sufficiently as a minor surface. The non-light-emitting area NA may include a circuit wiring portion NA1 and a transmission portion NA2. The transmission portion NA2 may be formed by making a transmission window 212a (refer to FIG. 3) in an opposing electrode 212 that is described below.

In addition, if the openings 410 of the reflection member 400 are merely formed corresponding to the sizes of the light-emitting areas LA1, LA2, and LA3, the above-described problem of diffuse reflection may not be solved. In other words, since inclined surfaces that reflect externally incident light in an irregular direction exist in the pixels P1, P2, and P3, reflective efficiency may be drastically lowered unless appropriate design features are introduced to counter this effect.

Thus, to prevent diffuse reflection in the present embodiment, reflection member 400 may be provided as illustrated in FIG. 3. Prior to describing the structure of reflection member 400, the structure of the display portion 200 covered by the reflection member 400 is briefly discussed. Referring to FIG. 3, a thin film transistor (TFT) may be formed on a buffer layer 202 on the substrate 100 and may be connected to a pixel electrode 211. The TFT may include an active layer 203, a gate electrode 205, a source electrode 207, and a drain electrode 208.

The active layer 203 may be formed of inorganic semiconductor, such as amorphous silicon or polysilicon, oxide semiconductor, or organic semiconductor, and may include a source region, a drain region, and a channel region. When the active layer 203 is formed of oxide semiconductor, the active layer 203 may be formed of an oxide of a metal selected from the elements of groups 12, 13, and 14, the metal oxide being selected from zinc (Zn), indium (In), gallium (Ga), tin (Sn), cadmium (Cd), germanium (Ge), hafnium (Hf), and a combination thereof. For example, the active layer 203 may include G-I-Z-O[$(In_2O_3)a(Ga_2O_3)b(ZnO)c$], where "a", "b", and "c" each are real numbers respectively satisfying conditions of a≥0, b≥0, and c>0.

A gate insulation film 204 may be formed on the active layer 203. The gate electrode 205 may be formed in a predetermined area on the gate insulation film 204. The gate insulation film 204 insulates the gate electrode 205 from the active layer 203. The gate insulation film 204 may be formed of an organic material or an inorganic material, such as $SiN_x$ or $SiO_2$.

The gate electrode 205 may include Au, Ag, Cu, Ni, Pt, Pd, Al, Mo, or an alloy such as Al:Nd alloy or Mo:W alloy. However, the present invention is not limited thereto, and the gate electrode 205 may be formed of a variety of materials considering the closeness with a neighboring layer, planarization, electrical resistance, and processability. Also, the gate electrode 205 may be formed in a single layer form or a multilayer form.

An interlayer insulation film 206 may be formed above the gate electrode 205. The interlayer insulation film 206 and the gate insulation film 204 may be formed to expose the source region and the drain region of the active layer 203. The source electrode 207 and the drain electrode 208 may be formed to respectively contact the exposed source and drain regions of the active layer 203.

The source electrode 207 and the drain electrode 208 may be formed of various conductive materials in a single layer structure or a multilayer structure. A passivation layer 209 may be formed on the source electrode 207 and the drain electrode 208. The passivation layer 209 may be formed to expose a predetermined area of the drain electrode 208, not entirely covering the drain electrode 208. The pixel electrode 211 is connected to the exposed part of the drain electrode 208.

The pixel electrode 211 may be formed in each of the pixels P1, P2, and P3 in an independent island form. A pixel-defining film 210 that surrounds and defines the areas of the pixels P1, P2, and P3, while covering the edge of the pixel electrode 211, is formed on the passivation layer 209.

A light-emitting layer 213 may be formed on the pixel electrode 211 in a pixel area defined by the pixel-defining film 210. The opposing electrode 212 may be formed on the light-emitting layer 213.

An inclined surface S may be formed along a boundary surface 210a of the pixel-defining film 210 in the display portion 200. In other words, a hole may be formed in the pixel-defining film 210 during a manufacturing process, so that the pixel-defining film 210 covers only an edge of the pixel electrode 211 and the center of the pixel electrode 211 is exposed. The boundary surface 210a that surrounds a pixel may be formed to be slightly inclined, not vertical, due to a characteristic of an etching process. Accordingly, the light-emitting layer 213 and the opposing electrode 212 formed on the boundary surface 210a of the pixel-defining film 210 that is inclined as described above may be formed to be inclined along the inclination of the boundary surface 210a. As a result, the inclined surface S may have the same inclination as the boundary surface 210a.

However, when external light is incident on the inclined surface S, the incident light may be reflected by the inclined surface S in an unexpected direction and thus reflective efficiency may be lowered. In a case in which external light is vertically incident, the light reflected by a portion covered by the reflection member 400 or the light reflected by the opposing electrode 212 in a pixel area defined by the pixel-defining film 210 is vertically reflected back out. However, the light incident on the inclined surface S may be reflected diffusely in an unexpected direction and thus reflective efficiency may be drastically lowered.

Thus, to solve the diffuse reflection problem, the reflection portion 420 of the reflection member 400 is formed to cover the inclined surface S. In other words, as illustrated in FIG. 3, the size of the opening portion 410 of the reflection member 400 may be formed to be smaller than the size of each of the pixels P1, P2, and P3 that are the light-emitting areas, and the edge of the pixel where the inclined surface S exists may be covered by the reflection portion 420. Accordingly, the phenomenon that the external incident light is reflected diffusely by the inclined surface S may be restricted. The opening portion 410 may have an inverted taper shape in which the size of the opening 410 gradually increases towards the display portion 200. If the opening portion 410 is tapered in an opposite shape, an inclined surface that may diffuse reflect external light like the inclined surface S of the pixel-defining film 210 may be formed around the opening portion 410. Thus, to address the above issue, the opening portion 410 is formed in the inverted taper shape.

Figure 4:
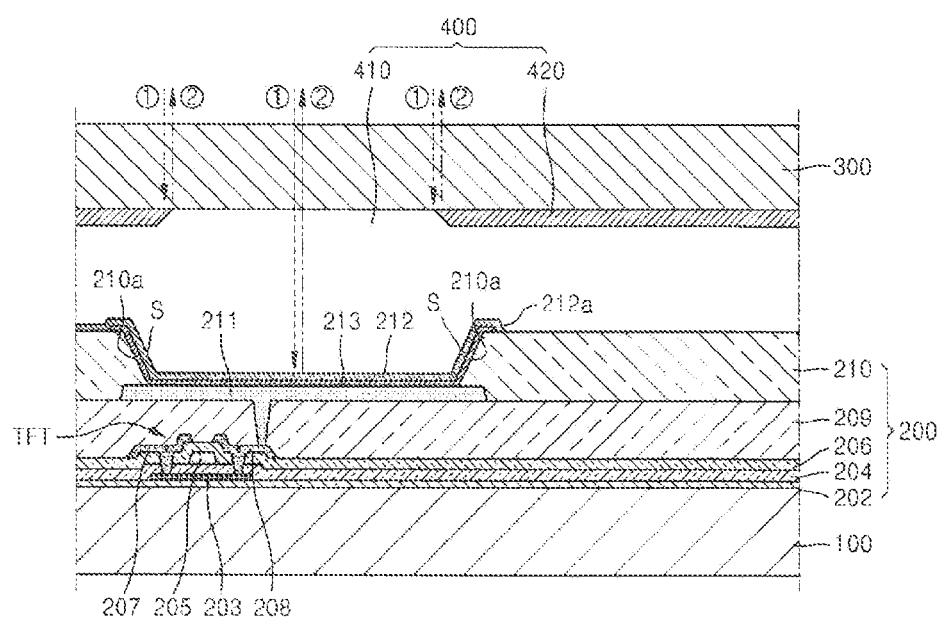
FIG. 4 is a cross-sectional view schematically illustrating the reflection of external light in the organic light-emitting apparatus of FIG. 3.

FIG. 4 is a cross-sectional view schematically illustrating the incidence and reflection of external light in the organic light-emitting apparatus of FIG. 3. Referring to FIG. 4, assuming a vertical incident light ①, if the inclined surface S is covered by the reflection portion 420 of the reflection member 400, diffuse reflection may be removed and reflected light ② that generally proceeds in a predetermined direction is formed. Accordingly, the efficiency of reflection of the external light may be much improved and thus, when the screen of an organic light-emitting display apparatus is used as a minor, a very clear mirror image may be seen.

The reflection member 400 may include at least one of nickel (Ni), chromium (Cr), tungsten (W), vanadium (V), and molybdenum (Mo) and may be formed of metal having a specular reflection characteristic. If a more uniform image having minimal deviation in reflective efficiency over all portions of a screen is required, the reflection rate of the reflection portion 420 may be set to be similar to that of each of the pixels P1, P2, and P3.

In the present embodiment, a pixel structure embodies a desired color by a combination of pixels that emit light of R, G, and B colors. However, the pixel structure may be a structure in which a common light-emitting layer is formed throughout the entire surface of the pixel area. The light-emitting layer may have a structure in which layers including light-emitting materials for emitting lights of, for example, red, green, and blue colors are vertically stacked or combined with one another to thus emit white light. The emitted white light may be embodied in a predetermined color by passing through a color conversion layer or a color filter. Thus, the organic light-emitting display apparatus according to the present embodiment may simultaneously and effectively embody not only an image display function but also a mirror function providing a clear image having restricted diffuse reflection.

Figure 5:
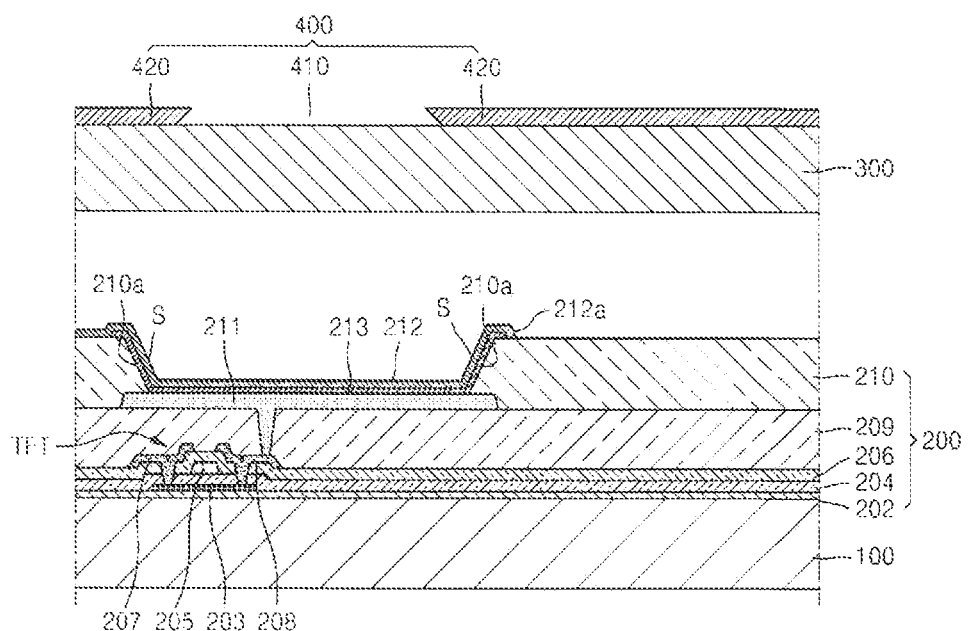
FIG. 5 is a cross-sectional view schematically illustrating a modified example of the organic light-emitting apparatus of FIG. 3.

In the above-described embodiment, the reflection member 400 is formed on the inner surface of the encapsulation member 300, that is, a surface facing the display portion 200. In another embodiment, as illustrated in FIG. 5, the reflection member 400 may be formed on an outer surface of the encapsulation member 300 that is opposite to the inner surface of the encapsulation member 300. In this case, only the position of the reflection member 400 is changed from one that is on the inner surface of the encapsulation member 300 to one that is on the outer surface thereof, and the inverted taper shape of the opening portion 410 or the structure of covering the edge area of a pixel by the reflection portion 420 are the same as those of the embodiment of FIG. 3.

Figure 6:
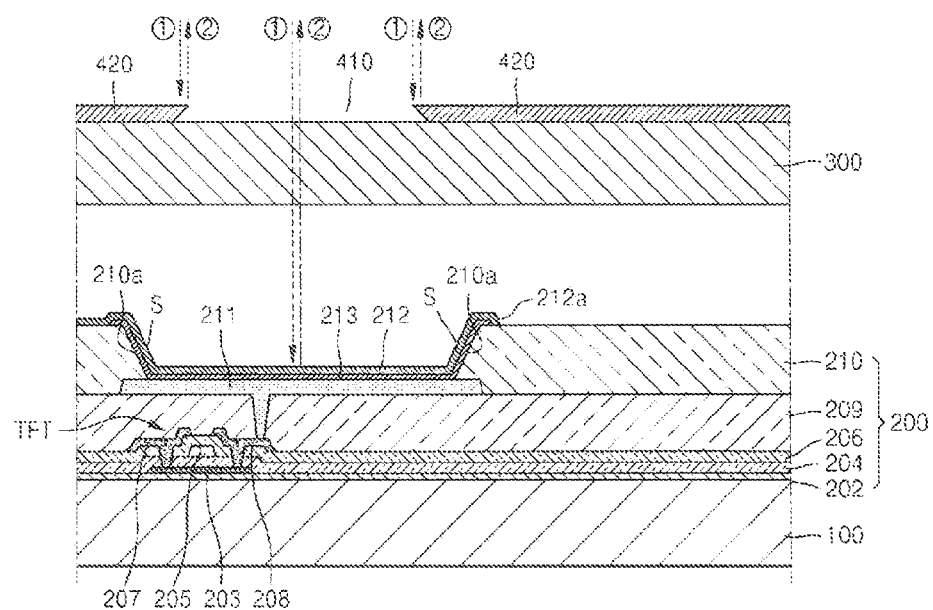
FIG. 6 is a cross-sectional view schematically illustrating the reflection of external light in the organic light-emitting apparatus of FIG. 5.

Thus, when the external light ① is input as illustrated in FIG. 6, since, in the present embodiment, the inclined surface S is covered by the reflection portion 420 of the reflection member 400, diffuse reflection is removed and the reflection light ② in a predetermined direction is formed. Thus, since the reflective efficiency of the external light is much improved, when the screen of an organic light-emitting display apparatus is used as a minor, a very clear minor image may be seen. Thus, the organic light-emitting display apparatus according to the present embodiment may simultaneously and effectively embody not only an image display function but also a minor function providing a clear image having a restricted level of diffuse reflection.

As described above, in the organic light-emitting display apparatus according to the present invention, since diffuse reflection with respect to incident light may be restricted, a clear minor function may be embodied through a screen of the organic light-emitting display apparatus.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An organic light-emitting display apparatus comprising:
   a substrate;
   a display portion formed on the substrate and including a light-emitting area and a non-light-emitting area surrounding the light-emitting area;
   an encapsulation member arranged to face the substrate with the display portion interposed therebetween; and
   a reflection member provided on the encapsulation member and including an opening portion aligned with the light-emitting area and a reflection portion surrounding the opening portion and extending to cover the non-light-emitting area, the opening portion comprising an opening,
   a size of the opening being smaller than that of the light-emitting area and thus an edge of the light-emitting area being covered by the reflection portion, the opening portion having an inverted taper shape, the size of the opening gradually increasing toward the display portion.

2. The organic light-emitting display apparatus of claim 1, an inclined surface being formed on the edge of the light-emitting area that is covered by the reflection portion.

3. The organic light-emitting display apparatus of claim 2, externally incident light being reflected diffusely from the inclined surface.

4. The organic light-emitting display apparatus of claim 3, the light-emitting area comprising a plurality of pixels that emit light of different colors.

5. The organic light-emitting display apparatus of claim 4, the plurality of pixels comprising:
   a pixel electrode connected to a thin film transistor;
   a pixel-defining film defining an area of each of the plurality of pixels;
   an opposing electrode facing the pixel electrode; and
   a light-emitting layer interposed between the pixel electrode and the opposing electrode in the pixel-defining film.

6. The organic light-emitting display apparatus of claim 5, the inclined surface being formed along a boundary surface of the pixel-defining film surrounding each of the plurality of pixels.

7. The organic light-emitting display apparatus of claim 1, the non-light-emitting area comprising a circuit wiring portion and a transmission portion.

8. The organic light-emitting display apparatus of claim 1, the reflection member being formed on a surface of the encapsulation member that faces the display portion.

9. The organic light-emitting display apparatus of claim 1, the reflection member being formed on a surface opposite to the surface of the encapsulation member that faces the display portion.

10. The organic light-emitting display apparatus of claim 1, the reflection portion of the reflection member having a specular reflection characteristic.

11. The organic light-emitting display apparatus of claim 10, the reflection member including any one of nickel (Ni), chromium (Cr), tungsten (W), vanadium (V), and molybdenum (Mo).

* * * * *